(12) United States Patent
Camerlo et al.

(10) Patent No.: US 7,098,408 B1
(45) Date of Patent: Aug. 29, 2006

(54) TECHNIQUES FOR MOUNTING AN AREA ARRAY PACKAGE TO A CIRCUIT BOARD USING AN IMPROVED PAD LAYOUT

(75) Inventors: Sergio Camerlo, Cupertino, CA (US); Lekhanh N. Dang, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 118 days.

(21) Appl. No.: 10/685,042

(22) Filed: Oct. 14, 2003

(51) Int. Cl.
*H05K 1/16* (2006.01)
(52) U.S. Cl. ............... 174/260; 174/261; 361/760; 361/777
(58) Field of Classification Search ......... 174/255, 174/260, 261, 250; 361/760, 767, 772, 774, 361/777, 792, 793, 794, 795
See application file for complete search history.

(56) References Cited

U.S. PATENT DOCUMENTS

| | | | |
|---|---|---|---|
| 5,519,580 A * | 5/1996 | Natarajan et al. ........... 361/760 |
| 5,844,782 A * | 12/1998 | Fukasawa ................... 361/774 |
| 5,847,936 A * | 12/1998 | Forehand et al. ........... 361/794 |
| 5,872,399 A * | 2/1999 | Lee ............................. 257/738 |
| 6,024,579 A | 2/2000 | Bennett |
| 6,194,782 B1 * | 2/2001 | Katchmar .................... 257/738 |
| 6,201,305 B1 * | 3/2001 | Darveaux et al. ........... 257/779 |
| 6,218,630 B1 * | 4/2001 | Takigami .................... 174/261 |
| 6,380,062 B1 | 4/2002 | Liu |
| 6,441,316 B1 * | 8/2002 | Kusui ........................ 174/260 |
| 6,552,277 B1 | 4/2003 | Downes |
| 6,552,436 B1 * | 4/2003 | Burnette et al. ............ 257/777 |
| 6,762,118 B1 | 7/2004 | Liu et al. |
| 6,773,269 B1 | 8/2004 | Downes |
| 2002/0071935 A1 * | 6/2002 | Wu ............................. 428/134 |

* cited by examiner

*Primary Examiner*—Ishwar (I. B.) Patel
(74) *Attorney, Agent, or Firm*—BainwoodHuang

(57) ABSTRACT

A circuit board assembly includes a printed circuit board (PCB). The PCB has a pad layout which includes a set of pads arranged in a two-dimensional array having at least two pads in a first direction and at least two pads in a second direction that is substantially perpendicular to the first direction. Each pad has (i) a central portion and (ii) multiple lobe portions integrated with the central portion and extending from the central portion of that pad. The circuit board assembly further includes a circuit board component mounted to the pad layout via a set of solder joints. The above-described pad layout (or land pattern) is well-suited for soldering to a variety of AAP devices (e.g., either a CCGA device or a BGA device).

16 Claims, 5 Drawing Sheets

TECHNIQUES FOR MOUNTING AN AREA ARRAY PACKAGE TO A CIRCUIT BOARD USING AN IMPROVED PAD LAYOUT

BACKGROUND

Surface mount technology (SMT) components are available in a wide variety of Area Array Package (AAP) types such as Ball Grid Array (BGA) packages and Ceramic Column Grid Array (CCGA) packages. A BGA package includes a two-dimensional array of ball-shaped contacts for mounting to a circuit board. In contrast, a CCGA package includes a two-dimensional array of column-shaped contacts for mounting to a circuit board.

When a circuit board manufacturer wishes to mount a BGA device to a circuit board, the manufacturer typically designs the circuit board to include a component mounting location having round circuit board pads corresponding to the two-dimensional array of ball-shaped contacts of the BGA device. To mount the BGA device to the component mounting location, the manufacturer prints solder paste over the round circuit board pads (e.g., using a stencil defining round solder paste apertures that mirror the round circuit board pads) and places the BGA device over the mounting location (e.g., using automated pick-and-place equipment). At this time, the ball-shaped contacts of the BGA device are (i) properly registered over the round circuit board pads and (ii) in contact with the printed solder paste. The manufacturer then applies heat (e.g., using an oven) to activate flux within the solder paste and to melt solder within the solder paste, thus soldering the ball-shaped contacts of the BGA device to the round circuit board pads of the circuit board.

When a circuit board manufacturer wishes to mount a CCGA device to a circuit board, the manufacturer typically configures the circuit board to include a component mounting location having larger diameter round circuit board pads or, alternatively, square circuit board pads which correspond to the two-dimensional array of column-shaped contacts of the CCGA device. For space considerations, square pads may be preferred. To mount the CCGA device to the mounting location, the manufacturer prints solder paste over the square circuit board pads, and registers the column-shaped contacts of the CCGA device over the square circuit board pads in a similar manner to that described above for a BGA device. Next, the manufacturer passes the poptilated circuit board through an oven to solder the column-shaped contacts of the CCGA device to the square circuit board pads of the circuit board.

SUMMARY

There are deficiencies to the above-described conventional approaches to mounting BGA and CCGA devices. For example, there are many off-the-shelf circuit board components that are available in both BGA and CCGA style packages. Functions may include, among others, processor, field programmable gate array (FPGA), bus control, and network interfacing. One component manufacturer may offer a particular component exclusively in a BGA package while another component manufacturer may offer the same component in a CCGA package. Similarly, the same component manufacturer may offer a particular component in either a BGA package or a CCGA package, but provide one of the these types (e.g., BGA or CCGA) at a lower cost thus making one of these package types more preferable to circuit board manufacturers.

Unfortunately, a circuit board manufacturer, who designs and manufacturers a circuit board which includes a component mounting location having square circuit board pads for a particular generic off-the-shelf circuit board component, is typically limited to mounting only the CCGA packaged version of that component to the component mounting location. If the circuit board manufacturer attempts to mount the BGA packaged version to the mounting location configured with the square circuit board pads in place of the CCGA packaged version, the circuit board manufacturer will likely encounter several quality control obstacles. In particular, the solder joints that form between the ball-shaped contacts of the BGA package and the square circuit board pads of the circuit board will tend to handle stresses improperly thus leading to fractures and perhaps electrical discontinuities in the solder joints. For example, when the circuit board begins operation after power-up, the circuit board and BGA device will heat up and expand at different rates. The ball-shaped contacts, which are rigidly fastened to the BGA package will thus try to move relative to the square circuit board pads. In such a situation, the characteristics of the solder joints (e.g., solder volume, shape and location of fillets, etc.) may not provide adequate bonding strength to maintain a healthy and robust connection and thus the solder joints may fail. Moreover, a circuit board leaving the circuit board manufacturer may not possess any solder joint fractures and may even pass an extensive variety of tests intended to thoroughly exercise the circuit board. However, fractures may still develop later on from cycling the circuit board through many periods of use, e.g., after powering the circuit board up and down many times thus causing the circuit board to expand and contract over and over again. Eventually, the expansion stresses between the ball-shaped contacts and the square circuit board pads will cause a crack (e.g., a microfracture) in one or more solder joints. In some situations, the crack will be so significant that an electrical signal will no longer reliably pass through the solder joint (e.g., causing an intermittent failure, causing a device failure repeatedly each time the circuit board has been in operation for a period of time, etc.).

Similarly, a circuit board manufacturer, who designs and manufacturers a circuit board which includes a component mounting location having round circuit board pads for a particular generic off-the-shelf circuit board component, is typically limited to mounting only the BGA packaged version of that component to the component mounting location. If the circuit board manufacturer attempts to mount a CCGA packaged version of the component to the mounting location configured with round circuit board pads rather than a BGA packaged version, the circuit board manufacturer will also encounter the same quality control obstacles as those described above in connection with the square circuit board pad situation. In particular, the solder joints that form between the column-shaped contacts of the CCGA devices and the round circuit board pads of the circuit board will tend to eventually succumb to fractures and perhaps electrical discontinuities in the solder joints. Although column-shaped contacts of CCGA devices tend to be more elastic in behavior than ball-shaped contacts of BGA devices, tests have shown that, in some situations, solder joints formed between CCGA devices and round circuit board pads tend to form more drastic fractures (i.e., larger cracks).

Based on the above-provided discussion, it should be understood that regardless of whether the manufacturer attempts to use a CCGA device on a circuit board having round circuit board pads or a BGA device on a circuit board having square circuit board pads, such an attempt could prove to be very costly to deal with. For example, a failure resulting from such an attempt would occur after a significant amount of value has been invested in the circuit board (i.e., at this point, the circuit board has been fully manufactured) leaving the prospect of reworking the circuit board to be the only alternative available to the circuit board manufacturer other than simply scrapping the circuit board. Additionally, a field service technician may be required to make several costly visits to trouble shoot a customer site and ultimately may be unable to identify the failure due to intermittent behavior of the failure and thus eventually have to replace the circuit board with a new one. Furthermore, there is the potential for developing a reputation for poor quality and losing significant customer goodwill if such failures are frequent and customers become frustrated with such failures. Accordingly, circuit board manufacturers typically use only CCGA devices on circuit boards having round circuit board pads, and BGA devices on circuit boards having square circuit board pads.

Nevertheless, it may be beneficial if a circuit board manufacturer has the capability of using either a CCGA packaged version or a BGA packaged version of a component. One way such a manufacturer can obtain such a benefit is for that manufacturer to make two different designs of the circuit board, i.e., one design having square pads for the CCGA packaged version of the component and another design having round pads for the BGA packaged version. Unfortunately, manufacturing two different circuit board designs is a very costly endeavor. Moreover, the cost for such an endeavor increases exponentially if the circuit board manufacturer were to attempt to apply the same approach for multiple components, i.e., the circuit board manufacturer would need $2^N$ different designs for N different components. Accordingly, manufacturers typically view this approach as being impractical and prohibitively expensive.

In contrast to the above-described conventional approaches to mounting CCGA and BGA components to circuit boards, embodiments of the invention are directed to techniques that enable a circuit board manufacturer to mount different package types (e.g., either a CCGA component or a BGA component) to a component mounting location having an improved pad layout and thus achieve excellent soldering results regardless of the package type. Accordingly, the circuit board manufacturer is capable of manufacturing a single design of the circuit board regardless of the package type.

One embodiment of the invention is directed to a circuit board assembly which includes a printed circuit board (PCB). The PCB has a pad layout which includes a set of pads arranged in a two-dimensional array having at least two pads in a first direction and at least two pads in a second direction that is substantially perpendicular to the first direction. Each pad has (i) a central portion and (ii) multiple lobe portions integrated with the central portion and extending from the central portion of that pad. The circuit board assembly further includes a circuit board component mounted to the pad layout via a set of solder joints. The above-described pad layout (or land pattern) is well-suited for soldering to a variety of AAP devices (e.g., either a CCGA device or a BGA device). Accordingly, the manufacturer of such a circuit board assembly can enjoy lower manufacturing costs by taking advantage of such flexibility, e.g., the manufacturer does not need multiple circuit board designs with round and square pads, the manufacturer has the freedom to acquire components from multiple sources even if the sources provide different package types, etc.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques that enable a circuit board manufacturer to mount different package types (e.g., either a CCGA component or a BGA component) to a component mounting location having an improved pad layout and thus achieve excellent soldering results regardless of the package type. Accordingly, the circuit board manufacturer is capable of manufacturing a single design of the circuit board regardless of the package type.

Figure 1:
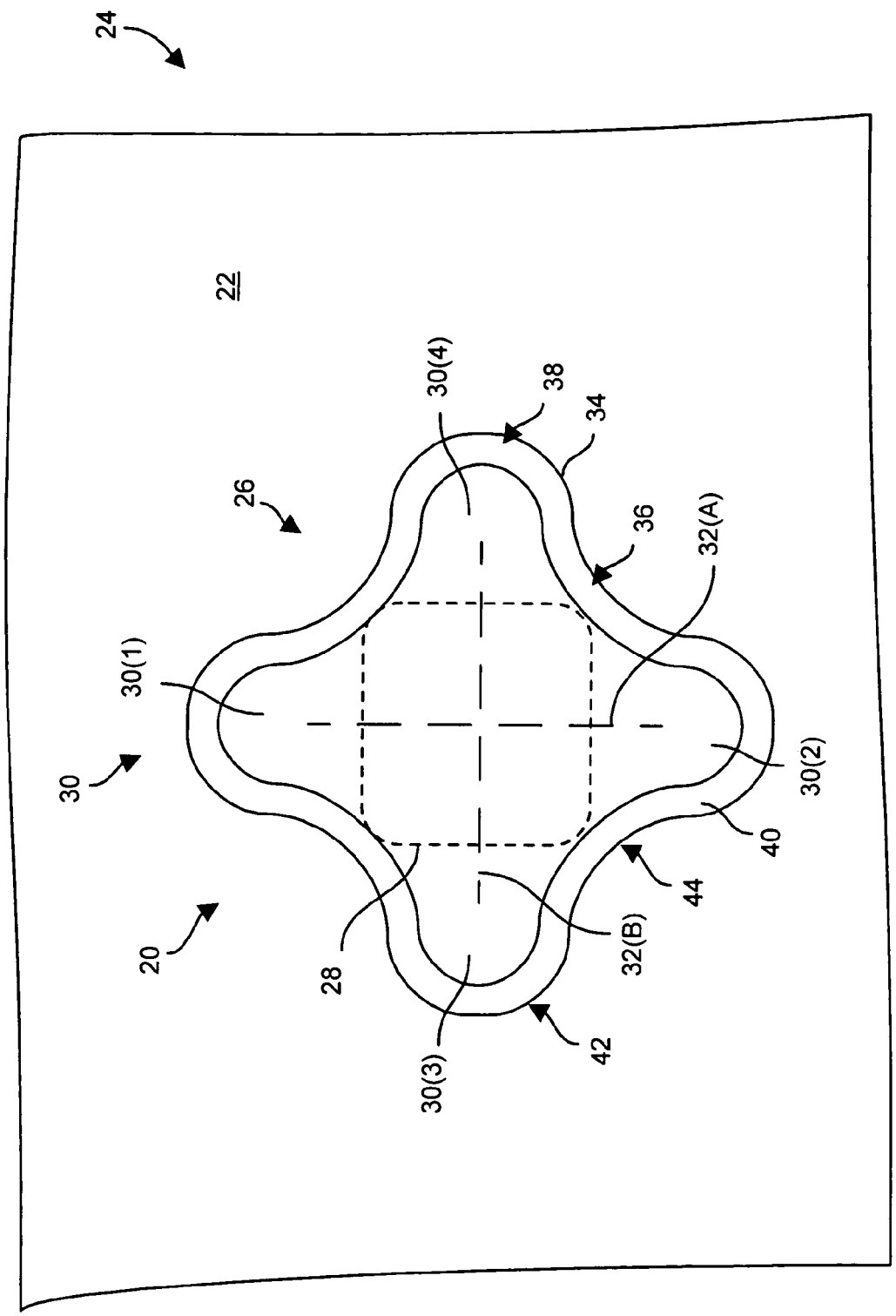
FIG. 1 is a top view of a circuit board pad which is suitable for use by the invention.

FIG. 1 is a top view of a circuit board pad 20 (or land pattern) which is suitable for use by the invention. The circuit board pad 20 resides on a surface 22 of a portion of circuit board 24 and is surrounded by a solder mask 26 which also resides on the surface 22 of the circuit board 24.

As shown in FIG. 1, the circuit board pad 20 has a general diamond-shaped, cross type pattern. To this end, the circuit board pad 20 includes a central portion 28 and multiple lobe portions 30 which are integral with the central portion 28. In particular, two lobe portions 30(1), 30(2) extend from the central portion 28 in opposite directions from each other along an axis 32(A) (see the dashed line 32(A)). Similarly, another two lobe portions 30(3), 30(4) extend from the central portion 26 in opposite directions from each other along an axis 32(B) (see the dashed line 32(B)) which is substantially perpendicular to the axis 32(A). As a result, the four lobe portions 30 radially extend from the central portion 28 to provide distributed solderable surfaces which are well-suited for wetting to a contact of a circuit board component. Accordingly, the pad 20 is configured to form a high bond strength solder joint.

As shown in FIG. 1, the solder mask 26 extends around a periphery of the circuit board pad 20. That is, the solder mask 26 defines an aperture 34 which mirrors the shape of the pad 20. In particular, the solder mask 26 defines a central aperture portion 36 and multiple lobe aperture portions 38 integrated with the central aperture portion 36 to substantially match the profile of the pad 20. The solder mask 26 further defines a clearance region 40 which substantially uniformly surrounds the pad 20. In one arrangement, the clearance region 40 is substantially 2 mils wide to provide adequate clearance as well as allow for minor tolerance differences in registration of the solder mask 26 with the pad 20 (e.g., +/−1 mil registration error).

It should be understood that a connecting surface trace is purposefully omitted from FIG. 1 for simplicity. Nevertheless, it should be understood that a connecting surface trace exists which connects the pad 20 to other circuit structures on the circuit board 24 (e.g., to a plated through hole leading to an internal trace, and so on). In one arrangement, the connecting surface trace connects to one of the lobe portions 30. In another arrangement, the connecting surface trace connects to the central portion 28.

It should be further understood that the circuit board pad 20 is shown in FIG. 1 as being copper defined by way of example only (i.e., the outer shape or profile of the pad 20, which forms the solderable surface, is determined by the shape of the copper of the pad 20). In another arrangement, the circuit board pad 20 is solder mask defined (i.e., solder mask 26 overlaps the outer edges of the copper, and the outer shape of the pad 20 is determined by the shape of the solder mask aperture 34).

The circuit board pad 20 is configured with particular dimensions that make the cross-shaped circuit board pad 20 well suited for soldering to either a ball-shaped contact of a BGA device or a column-shaped contact of a CCGA device. By way of example only, the central portion 28 has a minimum width of substantially 18 mils (along the center lines), and the lobe portions 30 expand that width to substantially 24 mils. Also, by way of example only, the lobe portions 30 define outer radii 42 of substantially 3 mils and inner radii 44 (i.e., inwardly bending radii that concavely bend toward the central portion 28) of substantially 8 mils. The outer radii 42 and inner radii 44 are preferably blended (e.g., either purposefully of by the etching process) to provide relatively smooth transitions between curves and no sharp angled intersections. As a result, the pad 20 is well suited for soldering to either a ball-shaped contact of BGA device (e.g., a solder ball which is substantially 24 mils in diameter) or a column-shaped contact of a CCGA device (e.g., a column which is substantially 24 mils wide on each side). Further details of the invention will now be provided with reference to FIGS. 2 and 3.

Figure 2:
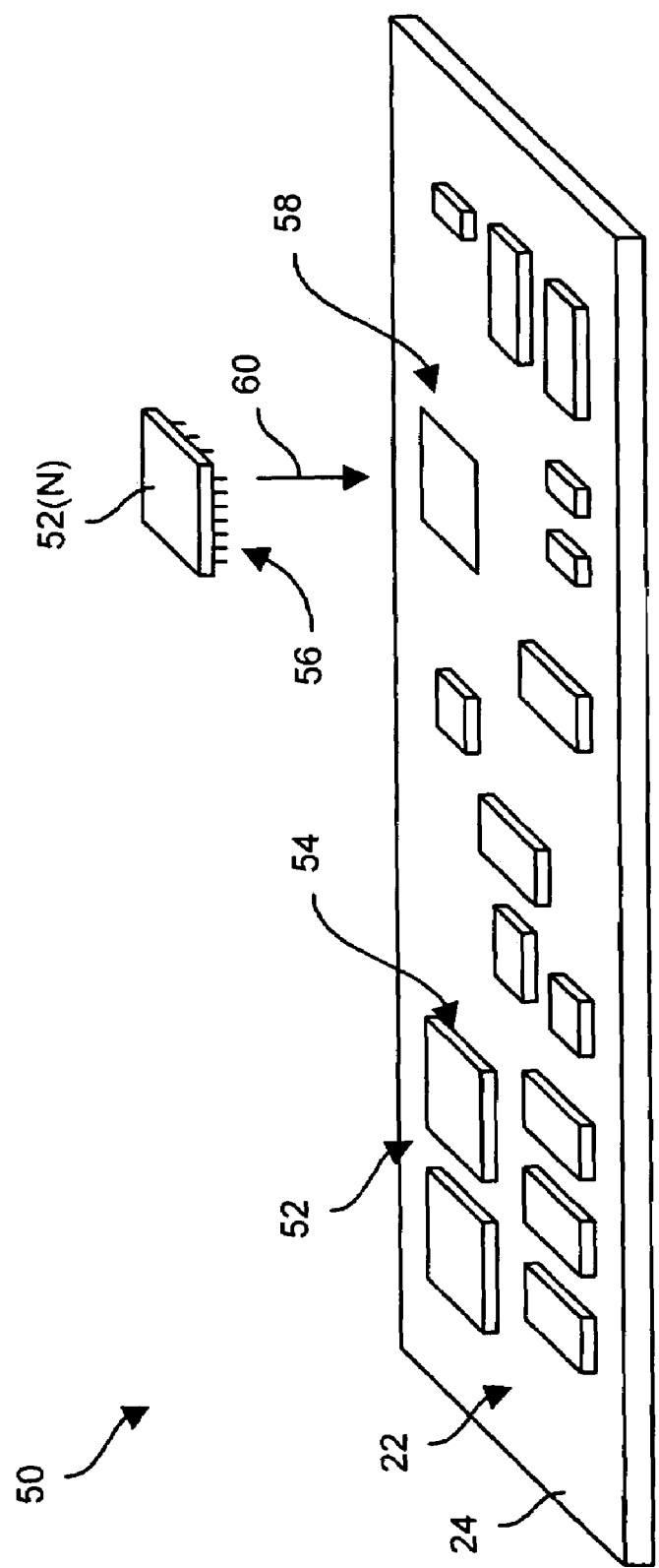
FIG. 2 is a partially exploded perspective view of a circuit board assembly which utilizes the circuit board pad of FIG. 1.

FIG. 2 shows a circuit board assembly 50 which utilizes the circuit board pad 20 of FIG. 1. The circuit board assembly 50 includes a fabricated circuit board 24, i.e., a PCB laminate composed of multiple layers of non-conductive material and conductive traces sandwiched together to form a rigid planar structure. The circuit board 50 further includes a set of circuit board components 52 soldered to the surface 22 of the circuit board 24. The components 52 mount to the circuit board 24 via corresponding sets of solder joints 54.

For illustration purposes only, one component 52(N) is shown detached from the circuit board 24 in FIG. 2 to show various aspects of the relationship between the component 52(N) and the circuit board 24. The component 52(N) is an Area Array Packaged (AAP) component having an array of component contacts 56 which is configured to mount to the circuit board 24. Similarly, the circuit board 24 has a component mounting location 58 which includes an array of circuit board pads 20 (also see FIG. 1) which corresponds to the array of component contacts 56.

Unless the component 52(N) is subject to a rework process and thus soldered to the circuit board 24 individually, the component 52(N) normally solders to the component mounting location 58 at the same time as the rest of the components 52. In one arrangement, a circuit board manufacturer prints solder paste onto the pads of the circuit board 24 (including the cross-shaped pads 20 of the component mounting location 58), e.g., using a stencil. The manufacturer then places the components 52 onto their respective locations on the circuit board 24 (see the arrow 60 for the component 52(N)), e.g., using automated pick-and-place equipment. The manufacturer then applies heat to solder the circuit board components 52 to the circuit board 24, e.g., using an oven. As a result, the components 52 robustly solder to the circuit board 22 to form the circuit board assembly 50.

Figure 3:
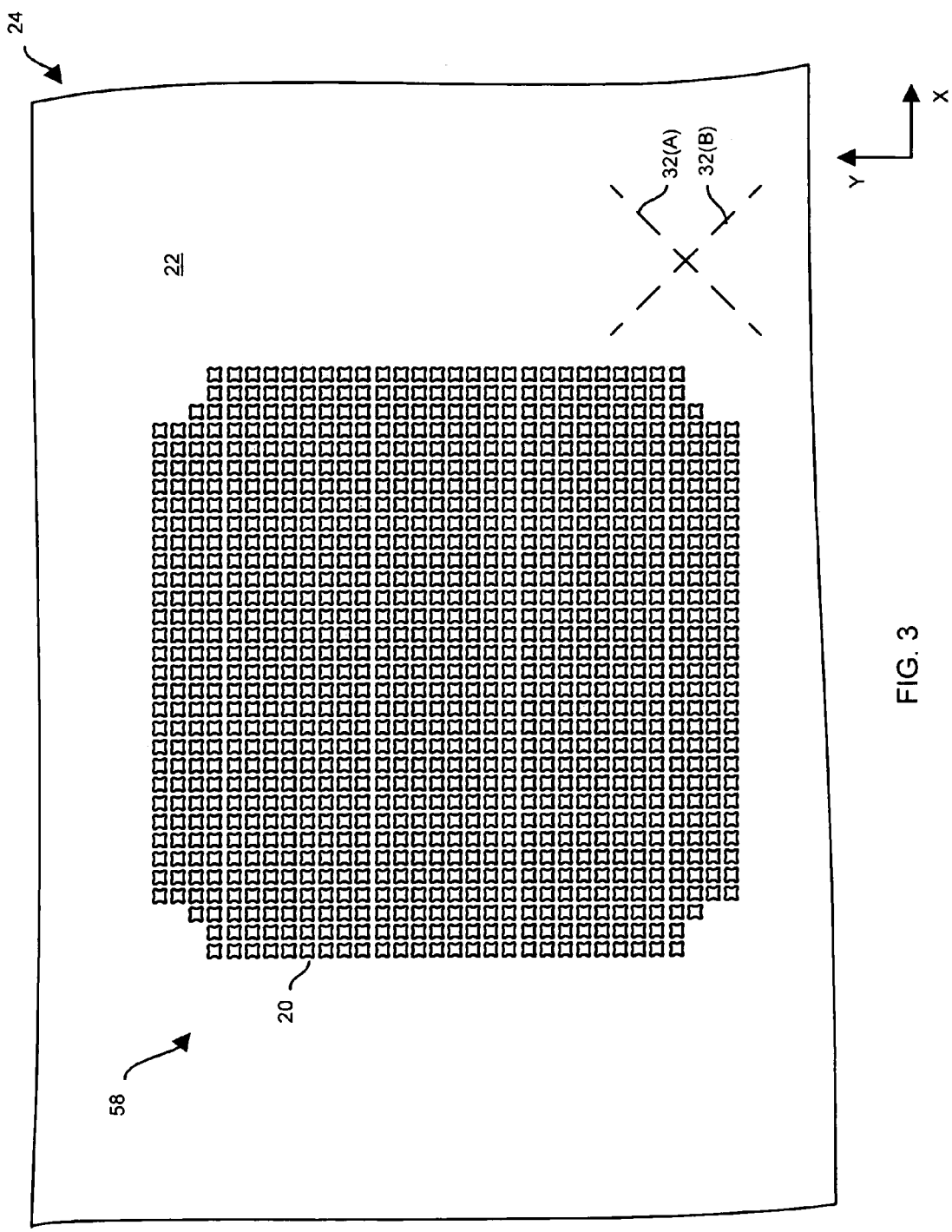
FIG. 3 is a top view of a pad layout of a component mounting location the circuit board assembly of FIG. 2.

FIG. 3 shows a top view of the component mounting location 58. As shown, the component mounting location 58 resides on the surface 22 of the circuit board 24, and includes a layout 70 of multiple circuit board pads 20 arranged in a two-dimensional array, i.e., with several pads 20 in the X-direction and several pads 20 in the Y-direction. The pads 20 are oriented such that the lobes extend along the axes 32(A), 32(B) at substantial 45 degree angles to the X and Y directions. This properly orients the pads 20 with respect to standard column orientations if the component 52(N) is a CCGA device, as well as enables the pads 20 to be positioned relatively close to each other for a fine pitch and high density configuration.

Again, it should be understood that the surface traces connecting to the circuit board pads 20 are purposefully omitted from FIG. 3 for simplicity. Nevertheless, it should be understood that surface traces exist which connect the pads 20 to other locations on the circuit board 24. It should also be understood that a solder mask 26 covers the surface 22 of the circuit board 24 but defines solder apertures 34 which expose the pad surfaces (also see FIG. 1) thus enabling the pads 20 to robustly solder to the contacts 56 of the component 52(N) (also see FIG. 2). Further details of the invention will now be provided with reference to FIGS. 4 and 5.

Figure 4:
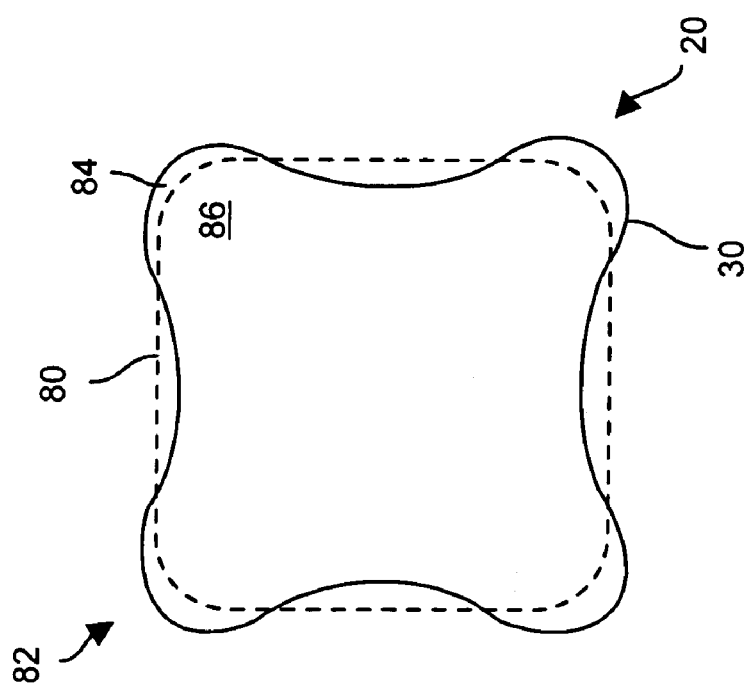
FIG. 4 is a detailed top view of the circuit board pad of FIG. 1 when a column-shaped contact of a CCGA device is soldered to the circuit board pad.

FIG. 4 shows a top view of the circuit board pad 20 of FIG. 1 when a column-shaped contact 80 of a CCGA device is soldered to the circuit board pad 20 (also see the component 52(N) of FIG. 2). As shown in FIG. 4, the column-shaped contact 80 (shown as a dashed line 80) registers over the pad 20 and a solder joint 82 binds the contact 80 to the pad 20, i.e., solder forms intermetallic bonds between the contact 80 and the pad 20. As shown, the geometry of the column-shaped contact 80 and the pad 20 generally match so that robust fillets 84 form at each corner 86 of the contact 80. Accordingly, the fillets 84 operate together to absorb stresses between the contact 80 and the pad 20 to provide resiliency against fractures. That is, healthy solder volume over each lobe portion 30 of the pad 20 (also see FIG. 1) provides elasticity and strength thus keeping the solder joint 82 intact with little or no fracturing. In particular, the fillets 84 withstand forces that would otherwise form a fracture in the solder joint 82 due to expansion of the component 52(N) and the circuit board 24 at different rates when the component 52(N) and the circuit board 24 heat up after initial power-up.

It should be understood that, during the soldering process, the lobe portions 30 provide a significant amount of surface area to attract and wet to molten solder. The rounded edges of the lobe portions 30 operate in a manner similar to that of conventional square pads to move the molten solder into locations on the pad 20 where it is best for proper strength and elasticity. Additionally, the interplay of the pad 20 with the column-shaped contact 80 results in little or no scattering of solder particles (i.e., solder fines or microballs) that would otherwise reduce surface insulation resistance (SIR) or pose a solder short threat. Accordingly, the molten solder forms a robust solder joint 82 that withstands crack initiations and crack propagation when subjected to normal stresses during operation. As a result, the circuit board 24 is well-suited for accommodating a component 52(N) with column-shaped contacts (i.e., a CCGA device).

Figure 5:
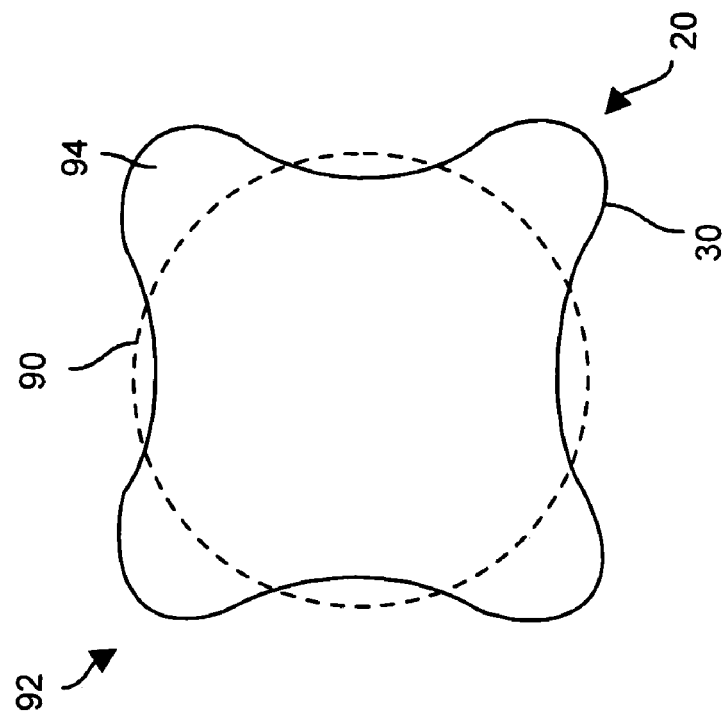
FIG. 5 is a detailed top view of the circuit board pad of FIG. 1 when a ball-shaped contact of a BGA device is soldered to the circuit board pad.

FIG. 5 shows a top view of the circuit board pad 20 of FIG. 1 when a ball-shaped contact 90 of a BGA device is soldered to the circuit board pad 20. As shown, the ball-shaped contact 90 registers over the pad 20 and a solder joint 92 binds the contact 90 to the pad 20 in a manner similar to that of the column-shaped contact 80 of FIG. 4. That is, solder forms intermetallic bonds between the contact 90 and the pad 20 in a well-distributed manner. In particular, the geometry of the ball-shaped contact 90 is such that robust fillets 94 form around the ball-shaped contact 90 in the areas of the lobe portions 30 of the pad 20. These fillets 94 operate together to absorb stresses between the contact 90 and the pad 20, e.g., forces caused by expansion of the component 52(N) and the circuit board 24 at different rates as the component 52(N) and the circuit board 24 heat up after initial power-up. Thus, a healthy amount of molten solder migrates over each lobe portion 30 of the pad 20 to form the fillets 94 of the solder joint 92 which provide robust elasticity and strength to keep the solder joint 92 intact with little or no fracturing.

It will be appreciated that, during the soldering process, the lobe portions 30 of the pad 20 provide a significant amount of surface area for wetting to molten solder. The rounded edges of the pad 20 and the ball-shaped contact 80 work together to form robust solder joint 92 that withstands crack initiations and crack propagation when subjected to normal stresses during operation. Accordingly, the circuit board 24 is well-suited for accommodating a component 52(N) with ball-shaped contacts (i.e., a BGA device).

It will be further appreciated that, in the future, there may be a movement toward the use of more environmentally friendly solders that do not contain Lead (Pb), e.g., lead-free solder containing Tin (Sn) with other metals such as silver (Ag), Bismuth (Bi), Copper (Cu), Antimony (Sb), Indium (In) and Zinc (Zn). Such lead-free solders typically have reduced wetting rates relative to lead-based solders. Nevertheless, the circuit board pad 20 is well suited for soldering to column-shaped or ball-shaped contacts using either lead-based and lead-free solders. That is, in a lead-based solder arrangement, the solderjoints 82, 92 are reliably formed substantially of lead-based solder. Similarly, in a lead-free solder arrangement, the solder joints 82, 92 are reliably formed substantially of lead-free solder. In any of these situations, the pad 20 forms a reliable solder joint 82, 92 with the corresponding component contact 80, 90. Further details of the invention will now be provided with reference to FIG. 6.

Figure 6:
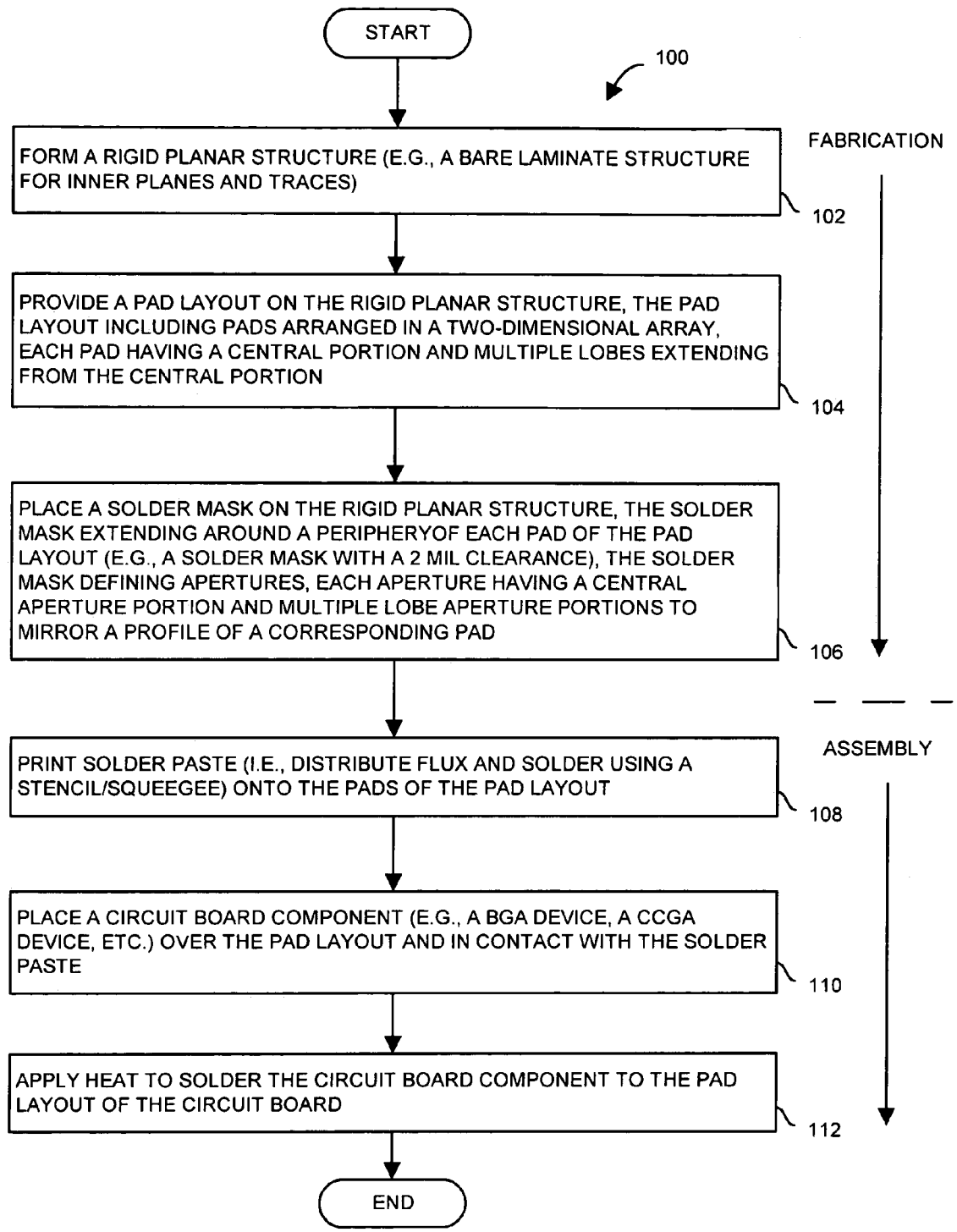
FIG. 6 is a flowchart of a procedure which is performed by a manufacturer of the circuit board assembly of FIG. 2.

FIG. 6 is a flowchart of a procedure 100 which is performed by a circuit board manufacturer when making the circuit board assembly 50 of FIG. 2. Steps 102 through 106 relate to fabrication of the circuit board 24. Steps 108 through 112 relate to populating the circuit board 24 with components 52.

In step 102, the manufacturer forms a rigid planar structure. In particular, the manufacturer glues and compresses a set of circuit board sheets together to form a bare laminate structure (i.e., PCB).

In step 104, the manufacturer provides a pad layout on the rigid planar structure. The pad layout (i.e., the component mounting location 58 of FIG. 2) includes a set of pads 20 arranged on the surface of the rigid planar structure in a two-dimensional array having at least two pads 20 in a first direction and at least two pads 20 in a second direction that is substantially perpendicular to the first direction (see FIGS. 1–3). FIG. 3 shows an exemplary high-density pad layout which is suitable for use by the invention. Each pad 20 has (i) a central portion 28 and (ii) multiple lobe portions 30 integrated with the central portion 28 and extending from the central portion 28.

In step 106, the manufacturer places a solder mask 26 on the rigid planar structure. The solder mask 26 extends around a periphery of each pad 20. The solder mask 26 defines solder apertures 34. Each solder aperture 34 has (i) a central aperture portion 36 and (ii) multiple lobe aperture portions 38 integrated with the central aperture portion 36 to mirror a profile of a corresponding pad 20 (also see FIG. 1). The solder mask 26 further defines a clearance region 40 preferably having a uniform thickness around each pad 20 (e.g., a clearance region 40 that is substantially 2 mils wide).

The circuit board 24 is now formed (also see FIG. 2) and ready for assembly. It will be appreciated that there are a variety of processes that can be used to manufacture the circuit board 24 and steps 102 through 106 (see above) describe just one. Other processes are suitable for use as well such as additive processes (i.e., processes that build-up the pads 20 by layering), subtractive processes (i.e., processes that strip down to form the pads 20 such as by etching), and subtractive-additive processes that use a combination of masks and layering to form the pads 20.

In step 108, the manufacturer prints solder paste over the pads 20 of the pad layout. In one arrangement, the manufacturer provides 100 percent solder paste coverage over the pads 20. This step preferably occurs when solder paste is distributed over all mounting locations of the circuit board 24 at the same time (e.g., by a stencil and squeegee system). Solder paste containing lead-based solder or lead-free solder is suitable for use in step 108.

In step 110, the manufacturer places a circuit board component over the set of pads 20 and in contact with the printed solder paste. This step preferably occurs while other components are placed over the circuit board as well (e.g., during a pick-and-place operation in an automated assembly process).

In step 112, the manufacturer applies heat to activate flux within the solder paste and to melt solder within the solder paste thus mounting the circuit board component to the pad layout. Here, the manufacturer preferably passes the circuit board through an over which simultaneously solders all of the components to the circuit board thus forming the circuit board assembly 50 of FIG. 2. As explained above, the lobe portions 30 of the circuit board pads 20 provide large surfaces to which molten solder easily wets thus forming reliable solder joints 82, 92 with robust fillets 84, 94.

Based on the above-provided discussion, it should be understood that, regardless of whether the manufacturer attempts to solder a CCGA device or a BGA device on the circuit board 24, the soldered device will robustly mount to the component mounting location 58 of the circuit board 24. In particular, the contacts of the device will form healthy solder joints 82, 92 (e.g., see FIGS. 4 and 5) which are capable of withstanding stresses encountered during normal operation (e.g., heat related expansion stresses resulting from powering the circuit board up and down). Accordingly, the manufacturer is able to take advantage of cost saving opportunities (e.g., the manufacturer has flexibility to develop second sources independently of packaging issues, the manufacturer can save costs by purchasing lower priced packaged devices, etc.). Moreover, the manufacturer is not burdened by having to make costly visits to trouble shoot failure circuit board assemblies that would otherwise be caused by cracks in the solder joints (i.e., microfractures) resulting from attempts to solder BGA devices to square pads or CCGA devices to round pads. Rather, the manufacture is capable of reliably using either CCGA or BGA devices with the diamond-shaped circuit board pads 20 and thus foster a positive reputation for quality and develop customer goodwill.

As mentioned above, embodiments of the invention are directed to techniques that enable a circuit board manufacturer to mount different package types (e.g., either a CCGA component or a BGA component) to a component mounting location 58 having an improved pad layout 70 (e.g., see FIG. 3) and thus achieve excellent soldering results regardless of the package type. Accordingly, the circuit board manufacturer is capable of manufacturing a single version of the circuit board 24 regardless of the package type.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the techniques of the invention are applicable to any solder alloy and any flux system (e.g., a lead-based solder system, a lead-free solder system, etc.) and the techniques enable the manufacture to provide optimized solderable surface geometries with improved solder flow and wetting. Soldering pads having such geometries tend to form strong and reliable solder joints, and such soldering pads reduce the likelihood of solder joint failure.

Additionally, it should be understood that the above-described pads 20 were explained above as being suitable for use in Area Array Package (AAP) applications. In some situations, the pads 20 can be used in other arrangements as well such as for soldering to non-AAP type devices, e.g., discreet components, custom packages, etc.

Furthermore, it should be understood that certain dimensions were provided for the pads 20 for illustrative purposes and by way of example only. It should be understood that the geometries of the pads 20 are scalable and that other dimensions are suitable for use by the pads 20 as well, e.g., for different sized ball-shaped contacts and colunm-shaped contacts.

Additionally, it should be understood that the cross-shaped patterns of the pads 20 were described above as being at 45 degrees to the X-Y axes (i.e., the axes of the pad array) by way of example only (see FIG. 3). In other arrangements, the cross-shaped patterns are at an angle other than 45 degrees to the X-Y axes. In one arrangement, the lobe portions 30 extend substantially in the directions of the X and Y axes thus making the orientation of the cross-shaped patterns of the pads 20 to be at 0 degrees to the X-Y axes.

Furthermore, it should be understood that the pads 20 are well suited for and compatible with any via scheme. In particular, the circuit board 24 is capable of using through holes, blind types which do not pass entirely through the circuit board, etc. The circuit board 24 is also capable of using standard vias (or microvias), via-in-pad approaches (e.g., large vias in the middle of the cross-pads 20, plated and capped), etc. For example, in an arrangement in which lobe portions 30 extend substantially in the directions of the X and Y axes thus making the orientation of the cross-shaped patterns of the pads 20 to be at 0 degrees to the X-Y axes, there is plenty of room between lobe portions 30 thus enabling connecting surface traces to connect diagonally to the pads 20 at a 45 degree angle to the X-Y axes.

Additionally, it should be understood that the pads 20 were described above as being well suited for manufacturers desiring compatibility between two different AAP applications (e.g., BGA and CCGA packages) by way of example only. It should be understood that the pads 20 are well suited for other applications as well. For example, a circuit board manufacturer may include the pads 20 in a circuit board design in which lead-based solder is initially used. Later, if the use of lead-free solder is desired, the manufacturer does not need to re-design the circuit board. Rather, the manufacturer can use the same pads 20, perhaps with a change in a small or minor parameter/dimension if any, e.g., increase (or decrease) the size/scale of the pads 20. Thus, the manufacturer avoids having to make significant changes to the circuit board design in order to accommodate lead-free solder. Such modifications and enhancements are intended to be part of various embodiments of the invention.

What is claimed is:

1. A pad layout for mounting with a circuit board component, the pad layout comprising:
    a set of pads arranged on a surface of a circuit board in a two-dimensional array having at least two pads in a first direction and at least two pads in a second direction that is substantially perpendicular to the first direction, each pad of the set of pads having (i) a central portion and (ii) multiple lobe portions integrated with the central portion and extending from the central portion of that pad;
    a solder mask on the surface of the circuit board, the solder mask extending around a periphery of each pad of the set of pads, the solder mask defining a set of apertures, each aperture having (i) a central aperture portion and (ii) multiple lobe aperture portions integrated with the central aperture portion to mirror a profile of a corresponding pad, the solder mask defining clearance regions around each pad of the set of pads;
    wherein, for each pad of the set of pads, that pad has exactly four lobe portions that extend from the central portion of that pad;
    wherein the circuit board component includes an integrated circuit package and multiple pre-soldered contacts extending from the integrated circuit package; and wherein the set of pads provide multiple metallic surfaces configured to simultaneously solder to the multiple pre-soldered contacts of the circuit board component during a circuit board assembly process involving printing solder paste onto the multiple metallic surfaces, picking and placing the circuit board component onto the solder paste and applying heat; and
    wherein, for each pad of the set of pads, (i) each lobe portion defines a distally disposed edge which is convex, (ii) each central portion define central portion edges which are concave, (iii) the distally disposed edges and the central portion edges blend smoothly in a manner that is free of sharp angled intersections, and (iv) each concave edge has a radius which is at least twice as large in value as a radius of every convex edge.

2. The pad layout of claim 1 wherein, for each pad of the set of pads, two of the four lobe portions of that pad extend along a first axis, and another two of the four lobe portions of that pad extend along a second axis that is substantially perpendicular to the first axis.

3. The pad layout of claim 1 wherein each pad of the set of pads has a profile having multiple outer radii of substantially 3 mils.

4. The pad layout of claim 3 wherein the profile of each pad of the set of pads further has multiple concave radii of substantially 8 mils.

5. The pad layout of claim 1 wherein the solder mask further defines clearance regions that are substantially 2 mils wide around each pad of the set of pads.

6. The pad layout of claim 1 wherein each pad of the set of pads substantially has:
   a first length along a first axis and the first length along a second axis that is substantially perpendicular to the first axis, and
   a second length along a third axis and the second length along a fourth axis that is substantially perpendicular to the third axis; and
   wherein the second length is greater than the first length.

7. The pad layout of claim 6 wherein the first and second axes are pivoted from the third and fourth axes by substantially 45 degrees.

8. The pad layout of claim 6 wherein the first length is substantially 18 mils and the second length is substantially 24 mils.

9. A circuit board, comprising:
   a set of circuit board layers combined to form a rigid planar structure having an outer surface; and
   a pad layout configured to mount with a circuit board component, the pad layout including a set of pads arranged on the surface of a circuit board in a two-dimensional array having at least two pads in a first direction and at least two pads in a second direction that is substantially perpendicular to the first direction, each pad of the set of pads having (i) a central portion and (ii) multiple lobe portions integrated with the central portion and extending from the central portion of that pad;
   a solder mask on the surface of the circuit board, the solder mask extending around a periphery of each pad of the set of pads, the solder mask defining a set of apertures, each aperture having (i) a central aperture portion and (ii) multiple lobe aperture portions integrated with the central aperture portion to mirror a profile of a corresponding pad, the solder mask defining clearance regions around each pad of the set of pads;
   wherein, for each pad of the set of pads, that pad has exactly four lobe portions that extend from the central portion of that pad, two of the four lobe portions of that pad extending along a first axis, and another two of the four lobe portions of that pad extending along a second axis that is substantially perpendicular to the first axis;
   wherein the circuit board component includes an integrated circuit package and multiple pre-soldered contacts extending from the integrated circuit package; and
   wherein the set of pads provide multiple metallic surfaces configured to simultaneously solder to the multiple pre-soldered contacts of the circuit board component during a circuit board assembly process involving printing solder paste onto the multiple metallic surfaces, picking and placing the circuit board component onto the solder paste and applying heat; and
   wherein, for each pad of the set of pads, (i) each lobe portion defines a distally disposed edge which is convex, (ii) each central portion define central portion edges which are concave, (iii) the distally disposed edges and the central portion edges blend smoothly in a manner that is free of sharp angled intersections, and
   (iv) each concave edge has a radius which is at least twice as large in value as a radius of every convex edge.

10. The circuit board of claim 9 wherein each pad of the set of pads has a profile having multiple outer radii of substantially 3 mils, and multiple concave radii of substantially 8 mils.

11. The circuit board of claim 9, the solder mask further defining clearance regions that are substantially 2 mils wide around each pad of the set of pads.

12. The circuit board of claim 9 wherein each pad of the set of pads substantially has:
   a first length along a first axis and the first length along a second axis that is substantially perpendicular to the first axis, and
   a second length along a third axis and the second length along a fourth axis that is substantially perpendicular to the third axis; and
   wherein the first and second axes are pivoted from the third and fourth axes by substantially 45 degrees, wherein the first length is substantially 18 mils, and wherein the second length is substantially 24 mils.

13. A circuit board assembly, comprising:
   a set of circuit board layers combined to form a rigid planar structure having an outer surface;
   a pad layout including a set of pads arranged on the surface of a circuit board in a two-dimensional array having at least two pads in a first direction and at least two pads in a second direction that is substantially perpendicular to the first direction, each pad of the set of pads having (i) a central portion and (ii) multiple lobe portions integrated with the central portion and extending from the central portion of that pad; and
   a solder mask on the surface of the circuit board, the solder mask extending around a periphery of each pad of the set of pads, the solder mask defining a set of apertures, each aperture having (i) a central aperture portion and (ii) multiple lobe aperture portions integrated with the central aperture portion to mirror a profile of a corresponding pad, the solder mask defining clearance regions around each pad of the set of pads;
   a circuit board component mounted to the pad layout via a set of solder joints;
   wherein, for each pad of the set of pads, that pad has exactly four lobe portions that extend from the central portion of that pad;
   wherein the circuit board component includes an integrated circuit package and multiple pre-soldered contacts extending from the integrated circuit package; and
   wherein the set of pads provide multiple metallic surfaces configured to simultaneously solder to the multiple pre-soldered contacts of the circuit board component during a circuit board assembly process involving printing solder paste onto the multiple metallic surfaces, picking and placing the circuit board component onto the solder paste and applying heat; and
   wherein, for each pad of the set of pads, (i) each lobe portion defines a distally disposed edge which is convex, (ii) each central portion define central portion edges which are concave, (iii) the distally disposed edges and the central portion edges blend smoothly in a manner that is free of sharp angled intersections, and
   (iv) each concave edge has a radius which is at least twice as large in value as a radius of every convex edge.

14. The circuit board assembly of claim 13 wherein the circuit board component includes a ceramic column grid array package having a set of column-shaped contacts corresponding to the set of pads.

15. The circuit board assembly of claim 13 wherein the circuit board component includes a ball grid array package having a set of ball-shaped contacts corresponding to the set of pads.

16. A circuit board assembly, comprising:
- a set of circuit board layers combined to form a rigid planar structure having an outer surface;
- a pad layout including a set of pads arranged on the surface of a circuit board in a two-dimensional array having at least two pads in a first direction and at least two pads in a second direction that is substantially perpendicular to the first direction, each pad of the set of pads having (i) a central portion and (ii) multiple lobe portions integrated with the central portion and extending from the central portion of that pad;
- a solder mask on the surface of the circuit board, the solder mask extending around a periphery of each pad of the set of pads, the solder mask defining a set of apertures, each aperture having (i) a central aperture portion and (ii) multiple lobe aperture portions integrated with the central aperture portion to mirror a profile of a corresponding pad, the solder mask defining clearance regions around each pad of the set of pads;
- a circuit board component;
- means for mounting the circuit board component to the set of pads of the pad layout;

wherein, for each pad of the set of pads, that pad has exactly four lobe portions that extend from the central portion of that pad;

wherein the circuit board component includes an integrated circuit package and multiple pre-soldered contacts extending from the integrated circuit package; and wherein the set of pads provide multiple metallic surfaces configured to simultaneously solder to the multiple pre-soldered contacts of the circuit board component during a circuit board assembly process involving printing solder paste onto the multiple metallic surfaces, picking and placing the circuit board component onto the solder paste and applying heat; and wherein, for each pad of the set of pads, (i) each lobe portion defines a distally disposed edge which is convex, (ii) each central portion define central portion edges which are concave, (iii) the distally disposed edges and the central portion edges blend smoothly in a manner that is free of sharp angled intersections, and (iv) each concave edge has a radius which is at least twice as large in value as a radius of every convex edge.

* * * * *